(12) United States Patent
Tanaka et al.

(10) Patent No.: US 9,184,196 B2
(45) Date of Patent: Nov. 10, 2015

(54) COLOR IMAGING ELEMENT AND IMAGING DEVICE

(71) Applicant: FUJIFILM CORPORATION, Tokyo (JP)

(72) Inventors: Seiji Tanaka, Saitama (JP); Kenkichi Hayashi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/589,380

(22) Filed: Jan. 5, 2015

(65) Prior Publication Data

US 2015/0109494 A1 Apr. 23, 2015

Related U.S. Application Data

(63) Continuation of application No. PCT/JP2013/068234, filed on Jul. 3, 2013.

(30) Foreign Application Priority Data

Jul. 6, 2012 (JP) ................................ 2012-152681

(51) Int. Cl.
*H01L 27/146* (2006.01)
*H04N 9/04* (2006.01)

(52) U.S. Cl.
CPC .......... *H01L 27/14621* (2013.01); *H04N 9/045* (2013.01)

(58) Field of Classification Search
CPC ........................ H04N 9/045; H01L 27/14621
USPC ......................................................... 348/277
See application file for complete search history.

(56) References Cited

U.S. PATENT DOCUMENTS

| 7,710,476 B2 * | 5/2010 | Nomura et al. ............... 348/273 |
| 2002/0149686 A1 | 10/2002 | Taubman |
| 2011/0019041 A1 | 1/2011 | Ishiwata et al. |

FOREIGN PATENT DOCUMENTS

| JP | 8-23543 A | 1/1996 |
| JP | 11-285012 A | 10/1999 |
| JP | 2000-308080 A | 11/2000 |
| JP | 2002-84548 A | 3/2002 |
| JP | 2005-136766 A | 5/2005 |

(Continued)

OTHER PUBLICATIONS

International Search Report issued in PCT/JP2013/068234, dated Sep. 17, 2013.

(Continued)

*Primary Examiner* — Gevell Selby
(74) *Attorney, Agent, or Firm* — Birch, Stewart, Kolasch & Birch, LLP

(57) ABSTRACT

A color filter array of a color imaging element includes a basic array pattern P of 4×4 pixels in which RGB filters corresponding to red (R), green (G) and blue (B) are arrayed, this basic array pattern P is repeatedly disposed in a horizontal direction and a vertical direction, a G filter is disposed in each pixel line in four directions of horizontality, verticality, oblique upper right and oblique lower right, and R and B filters are disposed in each pixel line in the horizontal direction and vertical direction of the color filter array. Moreover, the color filter array includes consecutive first filters of two or more pixels in four directions of horizontality, verticality, oblique upper right and oblique lower right.

10 Claims, 13 Drawing Sheets

(56) References Cited

FOREIGN PATENT DOCUMENTS

| | | |
|---|---|---|
| JP | 2010-512048 A | 4/2010 |
| JP | 2011-29379 A | 2/2011 |
| WO | WO 2008/066698 A2 | 6/2008 |

OTHER PUBLICATIONS

Written Opinion of the International Searching Authority issued in PCT/JP2013/068234, dated Sep. 17, 2013.

* cited by examiner

US 9,184,196 B2

COLOR IMAGING ELEMENT AND IMAGING DEVICE

CROSS-REFERENCE TO RELATED APPLICATIONS

This application is a Continuation of PCT International Application No. PCT/JP2013/068234 filed on Jul. 3, 2013, which claims priority under 35 U.S.C. §119(a) to Japanese Patent Application No. 2012-152681 filed on Jul. 6, 2012. Each of the above applications is hereby expressly incorporated by reference, in their entirety, into the present application.

BACKGROUND OF THE INVENTION

1. Field of the Invention

The present invention relates to a color imaging element and an imaging device, and specifically relates to a color imaging element that can reduce occurrence of color moire and achieve high resolution, and a color imaging device including the color imaging element.

2. Description of the Related Art

In a single-plate color imaging element, since a monochromatic color filter is set on each pixel, each pixel has only monochrome color information. Therefore, since an output image of the single-plate color imaging element is a RAW image (mosaic image), a multi-channel image is acquired by processing (demosaicing process) that interpolates a missing color pixel with a surrounding pixel. In this case, there is a problem in reproduction characteristic of an image signal of high frequency, and, since aliasing is likely to occur in a taken image in a color imaging element as compared with a black-and-white imaging element, there is an important problem that a reproduction band is widened for high resolution while suppressing occurrence of color moire (false color).

In a primary color Bayer array that is a color array of a color filter that is used in a single-plate color imaging element most widely, since green (G) pixels are disposed in a checkered pattern and red (R) and blue (B) are disposed in a line-sequential manner, there is a problem in reproduction precision when generating a high frequency signal in which G signals are in an oblique direction and R and B signals are in a horizontal direction and a vertical direction.

In a case where a black-and-white stripe pattern (high-frequency image) as illustrated in (A) of FIG. 12 enters a color imaging element having a color filter of a Bayer array illustrated in (B) of FIG. 12, when this is distributed to a Bayer color array and comparison is performed every color, as illustrated in (C) to (E) of FIG. 12, R becomes a mosaic color image of light and flat, B becomes a mosaic color image of dark and flat, and G becomes a mosaic color image of light and shade. While it is originally a black-and-white image, concentration difference (level difference) is not caused among RGB but it enters a state where it is colored depending on the color array and input frequency.

Similarly, in a case where an oblique black-and-white high-frequency image as illustrated in (A) of FIG. 13 enters an imaging element having a color filter of a Bayer array illustrated in (B) of FIG. 13, when this is distributed according to the Bayer color array and comparison is performed in each color, as illustrated in (C) to (E) of FIG. 13, R and B become a color image of light and flat and G becomes a color image of dark and flat. If a value of the black is assumed to be 0 and a value of the white is assumed to be 255, only G becomes 255 and therefore oblique black-and-white high-frequency image becomes green. Thus, in the Bayer array, it is not possible to correctly reproduce an oblique high-frequency image.

In general, it is avoided by disposing an optical low-pass filter including a birefringent material such as crystal in front of a color imaging element and optically decreasing high frequency in an imaging device using a single-plate color imaging element. However, it is possible to mitigate coloring by aliasing of high-frequency signals in this method, but there is a problem that resolution degrades due to its negative effect.

To solve such a problem, there is suggested a color imaging element where an color filter array of the color imaging element is assumed to be a three-color random array satisfying array restriction conditions in which an arbitrary target pixel is adjacent to three colors including a color of a target pixel on any of four sides of the target pixel (Japanese Patent Application Laid-Open No. 2000-308080: PTL 1).

Moreover, there is suggested an image sensor of a color filter array (color imaging element) where the image sensor includes a plurality of filters with different spectral sensitivities, and a first filter and a second filter among them are alternately disposed in a first period in one diagonal direction of a pixel grid of the image sensor and are alternately disposed in a second period in other diagonal direction (Japanese Patent Application Laid-Open No. 2005-136766: PTL 2).

In addition, there is suggested a color array where, in a color solid-state imaging element of three primary colors of RGB (color imaging element), a set of three pixels in which R, G and B are horizontally disposed are disposed in a zigzag manner in a vertical direction to make appearance probabilities of RGB respectively equal and to cause an arbitrary line (horizontal, vertical and oblique lines) on an imaging plane to pass through all colors (Japanese Patent Application Laid-Open No. 11-285012: PTL 3).

Furthermore, there is suggested a color imaging element where R and B among three primary colors of RGB are disposed every three pixels in horizontal and vertical directions and G is disposed between R and B (Japanese Patent Application Laid-Open No. 8-023543: PTL 4).

SUMMARY OF THE INVENTION

In the color imaging element described in PTL 1, since the filter array is random, when demosaicing process is performed in a subsequent stage, optimization has to be performed every random pattern, and there is a problem that the demosaicing process becomes complex. Moreover, it is effective for color moire of low frequency in the random array, but it is not effective for a false color of a high-frequency part. Here, the demosaicing process denotes processing that calculates color information on all of RGB pixels from the mosaic images of RGB according to the color filter array of the single-plate color imaging element (conversion into a simultaneous type), and also denotes demosaicing processing or synchronization processing (which are the same in this specification).

Moreover, in the color imaging element described in PTL 2, since the G pixels (brightness pixels) are disposed in a checkered (checker flag) pattern, there is a problem that the pixel reproduction precision in a limit resolution area (especially in an oblique direction) is not good.

In the color imaging element described in PTL 3, there is an advantage that it is possible to suppress occurrence of a false color since there are filters of all colors on an arbitrary straight line, but there is a problem that ratios of the pixel numbers of RGB are the same and therefore reproducibility of the high frequency degrades as compared with the Bayer array. Here, in the case of the Bayer array, a ratio of the pixel number of G that most contributes to acquire a brightness signal is twice the pixel number of each of R and B.

Meanwhile, in the color imaging element described in PTL 4, the ratio of the pixel number of G is six times the pixel number of each of R and B, which is higher than the Bayer array, and, since there is a line with only G pixels in the horizontal or vertical direction, it is not effective for a false color of the high-frequency part in the horizontal or vertical direction.

The present invention is made in view of such circumstances, and it is an object to provide a color imaging element that can suppress occurrence of a false color, achieve high resolution and simplify processing in a subsequent stage as compared with a random array in the related art. Moreover, it is an object of the present invention to provide an imaging device using such a color imaging element.

To achieve the object, one mode of the present invention is a single-plate color imaging element including: multiple pixels, each of which includes a photoelectric conversion element arrayed in a first direction and a second direction which is perpendicular to the first direction; and color filters which are respectively arrayed on the multiple pixels, wherein: an array of the color filters includes a basic array pattern formed by arraying the color filters in an array pattern corresponding to 4×4 pixels in the first direction and the second direction, and the basic array pattern is repeatedly disposed in the first direction and the second direction; the array of the color filters includes a first filter corresponding to a first color of one or more colors and second filters corresponding to second colors of two or more colors whose contribution ratio to acquire a brightness signal is lower than that of the first color; one or more first filters are disposed in a pixel line in each direction including the first direction, the second direction, and a third direction and a fourth direction that incline to the first direction and the second direction in the array of the color filters, and two first filters are disposed in each pixel line in the first direction and the second direction in the basic array pattern; one second filter corresponding to each color of the second colors is disposed in each pixel line in the first direction and the second direction in the basic array pattern; and the array of the color filters includes consecutive first filters of two or more pixels in the first direction, the second direction, the third direction and the fourth direction.

Another mode of the present invention is a single-plate color imaging element including: multiple pixels, each of which includes a photoelectric conversion element arrayed in a first direction and a second direction which is perpendicular to the first direction; and color filters which are respectively arrayed on the multiple pixels, wherein: an array of the color filters includes a basic array pattern formed by arraying the color filters in an array pattern corresponding to 4×4 pixels in the first direction and the second direction, and the basic array pattern is repeatedly disposed in the first direction and the second direction; the array of the color filters includes a first filter corresponding to a first color of one or more colors whose transmittance peak is within a wavelength range from 480 nm or more to 570 nm or less, and second filters corresponding to second colors of two or more colors whose transmittance peak is outside the wavelength range from 480 nm or more to 570 nm or less; one or more first filters are disposed in a pixel line in each direction including the first direction, the second direction, and a third direction and a fourth direction that incline to the first direction and the second direction in the array of the color filters, and two first filters are disposed in each pixel line in the first direction and the second direction in the basic array pattern; one second filter corresponding to each color of the second colors is disposed in each pixel line in the first direction and the second direction in the basic array pattern; and the array of the color filters includes consecutive first filters of two or more pixels in the first direction, the second direction, the third direction and the fourth direction, respectively.

Another mode of the present invention is a single-plate color imaging element including: multiple pixels, each of which includes a photoelectric conversion element arrayed in a first direction and a second direction which is perpendicular to the first direction; and color filters which are respectively arrayed on the multiple pixels, wherein: an array of the color filters includes a basic array pattern formed by arraying the color filters in an array pattern corresponding to 4×4 pixels in the first direction and the second direction, and the basic array pattern is repeatedly disposed in the first direction and the second direction; the color filters include a first filter corresponding to a first color of one or more colors and second filters corresponding to second colors of two or more colors whose transmittance is lower than that of the first filter within a wavelength range from 500 nm or more to 560 nm or less; one or more first filters are disposed in a pixel line in each direction including the first direction, the second direction, and a third direction and a fourth direction that incline to the first direction and the second direction in the array of the color filters, and two first filters are disposed in each pixel line in the first direction and the second direction in the basic array pattern; one second filter corresponding to each color of the second colors is disposed in each pixel line in the first direction and the second direction in the basic array pattern; and the array of the color filters includes consecutive first filters of two or more pixels in the first direction, the second direction, the third direction and the fourth direction.

Another mode of the present invention is a single-plate color imaging element including: multiple pixels, each of which includes a photoelectric conversion element arrayed in a first direction and a second direction which is perpendicular to the first direction; and color filters which are respectively arrayed on the multiple pixels, wherein: an array of the color filters includes a basic array pattern formed by arraying the color filters in an array pattern corresponding to 4×4 pixels in the first direction and the second direction, and the basic array pattern is repeatedly disposed in the first direction and the second direction; the color filter includes first filters corresponding to first colors of two or more colors including a color that most contributes to a brightness signal among three primary colors and a fourth color that is a different color from three primary colors, and second filters corresponding to second colors of two or more colors other than the first colors; one or more first filters are disposed in a pixel line in each direction including the first direction, the second direction, and a third direction and a fourth direction that incline to the first direction and the second direction in the array of the color filters, and two first filters are disposed in each pixel line in the first direction and the second direction in the basic array pattern; one second filter corresponding to each color of the second colors is disposed in each pixel line in the first direction and the second direction in the basic array pattern; and the array of the color filters includes consecutive first filters of two or more pixels in the first direction, the second direction, the third direction and the fourth direction.

According to these modes, since the first filter of one or more pixels are disposed in the pixel line in each direction of the first to fourth directions of the array of the color filters, it is possible to improve the reproduction precision of demosaicing processing in a high-frequency area. Moreover, since one or more second filters corresponding to the second colors of two or more colors other than the first color are also disposed in each pixel line in the first and second directions of the color filter array, it is possible to suppress the occurrence of color moire (false color) and achieve high resolution. Here, the basic array pattern corresponding to 4×4 pixels is a minimum size that satisfies the above-mentioned conditions.

Moreover, in the array of the color filter, since the basic array pattern is repeatedly disposed in the first and second directions, when demosaicing processing in the subsequent stage is performed, it is possible to perform the processing according to the repeating pattern and simplify the processing in the subsequent stage as compared with a random array in the related art.

In addition, since the pixel number of the first colors of two or more colors corresponding to the first filters is twice the pixel number of each color of the second colors corresponding to the second filters, the aliasing can be suppressed and the high-frequency reproducibility is also good.

In addition, the array of the color filter includes consecutive first filters of two or more pixels in the first direction, the second direction, the third direction and the fourth direction, respectively. By this means, it is possible to determine a direction with a small brightness change (direction with high correlation) among the first to fourth directions at minimum pixel intervals, on the basis of the output of two pixels corresponding to each of the consecutive first filters.

In the color imaging element according to another mode of the present invention, the contribution ratio of the first color to acquire a brightness signal can be equal to or greater than 50% and the contribution ratio of the second colors to acquire the brightness signal can be less than 50%.

In the color imaging element according to another mode of the present invention, it is preferable that the first color includes a color of one or more colors among first green (G), second green (G) whose wavelength region is different from the first green (G), and white (W), and the second colors include colors of red (R) and blue (B).

An imaging device to achieve the object of the present invention includes: an imaging optical system; a color imaging element in which an object image is formed through the imaging optical system; and an image data generation unit configured to generate image data of the formed object image, where the color imaging element is a color imaging element according to any of the above-mentioned modes.

According to the color imaging element and imaging device of the present invention, since one or more first filter corresponding to a brightness pixel are disposed in the pixel line in each direction of the first to fourth directions of the array of the color filter, it is possible to improve the reproduction precision of demosaicing processing in a high-frequency area. Moreover, since one second filter corresponding to the second colors of two or more colors is disposed in each pixel line in the first direction and second direction in the basic array pattern, it is possible to suppress the occurrence of color moire (false color) and achieve high resolution.

Moreover, in the color filter array according to the present invention, since the basic array pattern is repeated in the first direction and the second direction, when demosaicing processing in the subsequent stage is performed, it is possible to perform the processing according to the repeating pattern as well as simplify the processing in the subsequent stage as compared with a random array in the related art. Especially, the basic array pattern corresponding to 4×4 pixels according to the present invention is a minimum size that satisfies the above-mentioned conditions.

In addition, since consecutive first filters of two or more pixels are disposed in the first direction, second direction, third direction and fourth direction respectively in the basic array pattern, it is possible to determine a direction with a small brightness change (direction with high correlation) among the first to fourth directions at minimum pixel intervals.

DETAILED DESCRIPTION OF EXEMPLARY EMBODIMENTS

[Entire Configuration of Digital Camera]

Figure 1:
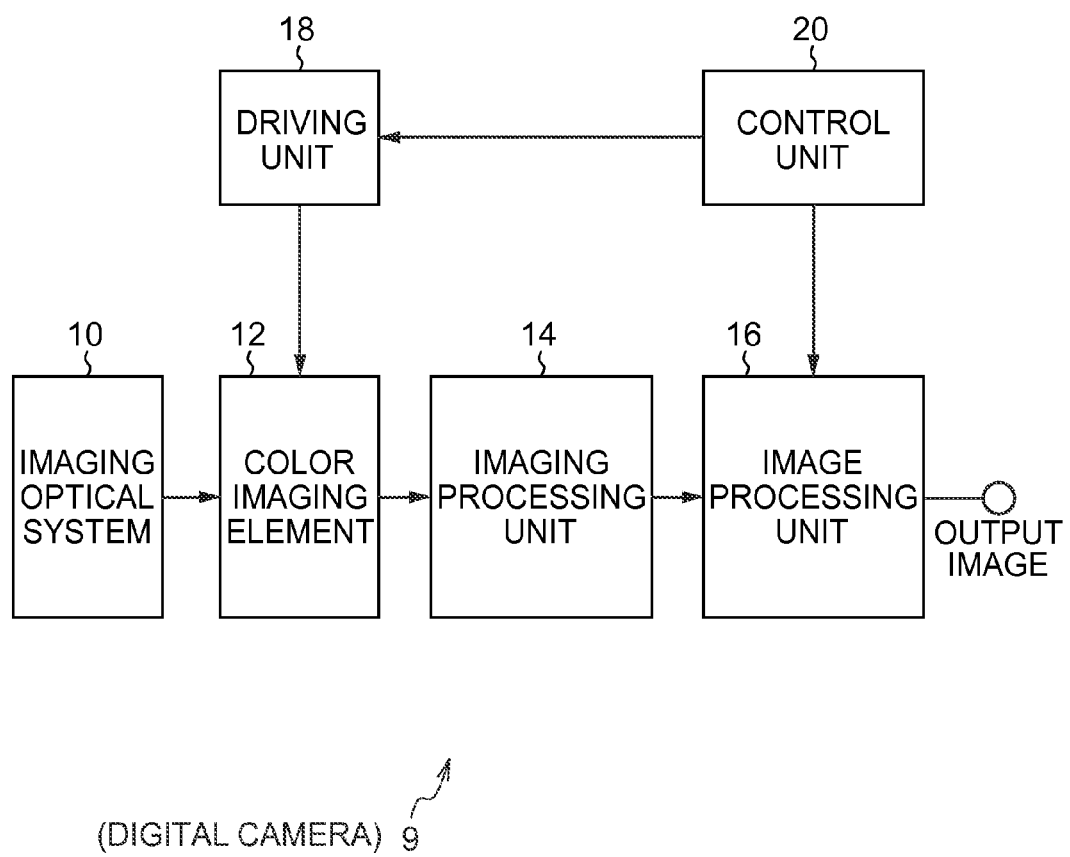
FIG. 1 is a block diagram illustrating an electrical configuration of a digital camera.

FIG. 1 is a block diagram of a digital camera 9 (imaging device) including a color imaging element according to the present invention. The digital camera 9 includes an imaging optical system 10, a color imaging element 12, an imaging processing unit 14, an image processing unit 16, a driving unit 18 and a control unit 20.

The imaging optical system 10 forms an object image on an imaging surface of the color imaging element 12. The color imaging element 12 is a so-called single-plate color imaging element including multiple pixels formed with photoelectric conversion elements two-dimensionally arrayed on the imaging surface, and a color filter provided above the light receiving surface of each pixel. Here, "on" and "above" indicate the direction on the side on which object light enters the imaging surface of the color imaging element 12.

The object image formed on the color imaging element 12 is converted into a signal charge corresponding to the amount of incident light by the photoelectric conversion element of each pixel. Signal charges accumulated in each photoelectric conversion element are sequentially read out from the color imaging element 12 as a voltage signal (image signal) corresponding to a signal charge on the basis of a readout instruction signal given from the driving unit 18 according to an instruction of the control unit 20. The image signals read out from the color imaging element 12 are signals showing the mosaic images of colors corresponding to the color filter array of the color imaging element 12. Here, the color imaging element 12 may be other kinds of imaging elements such as a CCD (Charge Coupled Device) imaging element and a CMOS (Complementary Metal Oxide Semiconductor) imaging element.

The image signals read out from the color imaging element 12 are input in the imaging processing unit 14 (image data generation unit). The imaging processing unit 14 includes a correlation double sampling circuit (CDS) to remove reset noise included in the image signals, an AGC circuit to amplify the image signals and control them to be a certain level, and an A/D converter. This imaging processing unit 14 outputs RAW data, which is formed by performing correlation double sampling processing on the input image signals and amplifying and converting them into digital image signals, to the image processing unit 16. Here, in a case where the color imaging element 12 is a CMOS imaging element, a digital image signal is directly read out from the color imaging element 12 and output to the image processing unit 16. Here, in a case where the color imaging element 12 is an MOS imaging element, the A/D converter is often built into in the imaging element, and there may be a case where the above-mentioned correlation double sampling is not required.

The image processing unit 16 (image data generation unit) includes a white balance correction circuit, a gamma correction circuit, a demosaicing process circuit (a processing circuit that calculates color information on all of the RGB pixels from the mosaic images of RGB according to the color filter array of the single-plate color imaging element 12 (conversion into a simultaneous type)), a brightness/color difference signal generation circuit, an outline correction circuit and a color correction circuit, and so on. The image processing unit 16 applies necessary signal processing to the RAW data of mosaic images input from the imaging processing unit 14 according to an instruction from the control unit 20, generates RGB pixel signals having color information on all of the RGB pixels, and, based on this, generates image data (YUV data) formed with brightness data (Y data) and color difference data (Cr and Cb data).

As for the image data generated in the image processing unit 16, a still image is subjected to compression processing in accordance with the JPEG standards by a compression/extension processing circuit, and a moving image is subjected to compression processing in accordance with the MPEG2 standards and subsequently recorded in unillustrated recording media (for example, a memory card) or output to and displayed on display means (not illustrated) such as a liquid crystal monitor. Here, in the present embodiment, the recording media are not limited to the one attachable to and detachable from the digital camera 9 and may be built-in magneto-optic recording media, and the display means is not limited to the one included in the digital camera 9 and may be an external display connected with the digital camera 9.

[Color Imaging Element]

Figure 2:
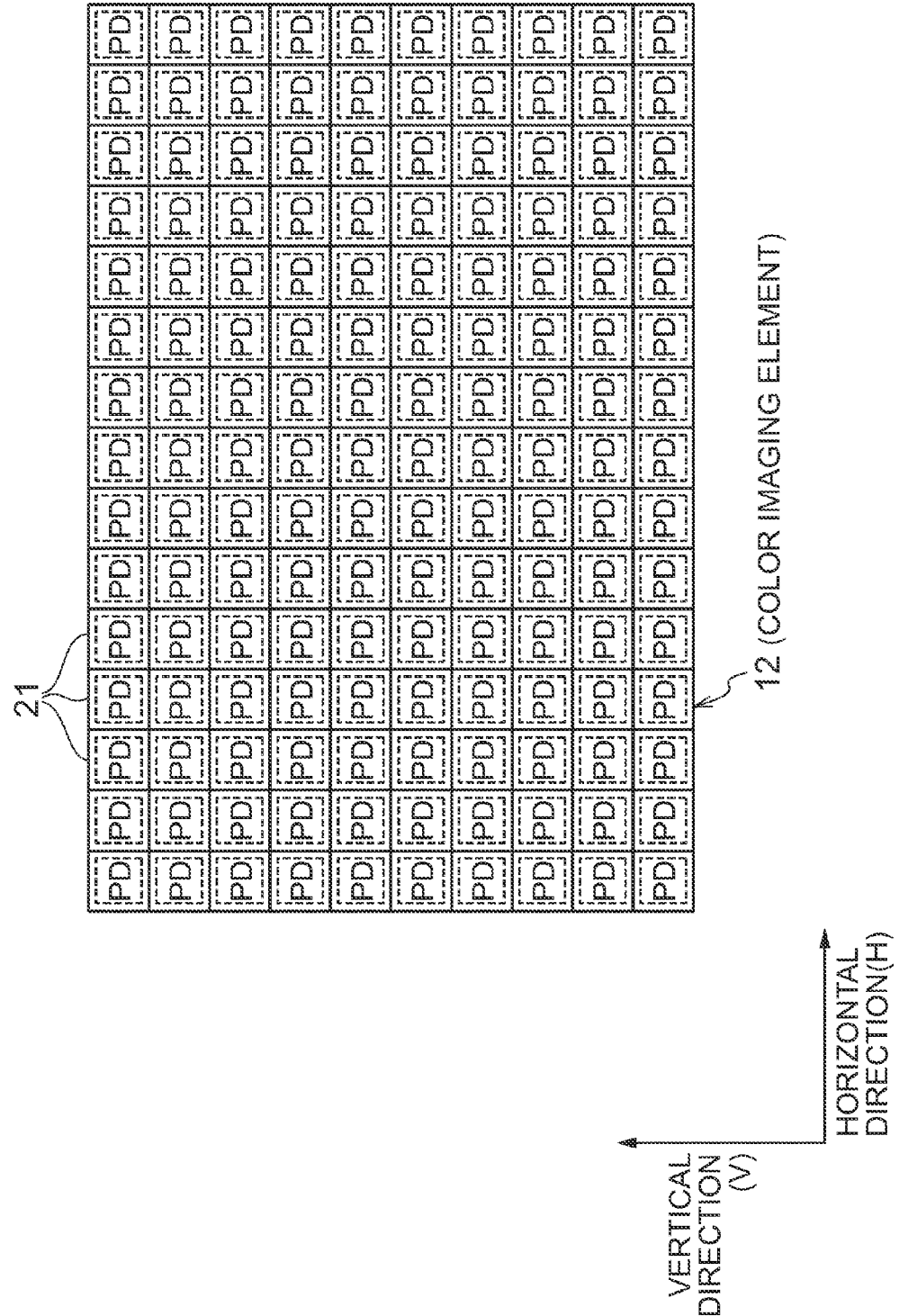
FIG. 2 is a front view of an imaging surface of a color imaging element.

As illustrated in FIG. 2, multiple pixels 21 formed with photoelectric conversion elements PD two-dimensionally arrayed in the horizontal direction and vertical direction are installed in the imaging surface of the color imaging element 12. Here, the horizontal direction corresponds to one direction of the first direction and second direction of the present invention, and the vertical direction corresponds to another direction of the first direction and second direction of the present invention.

Figure 3:
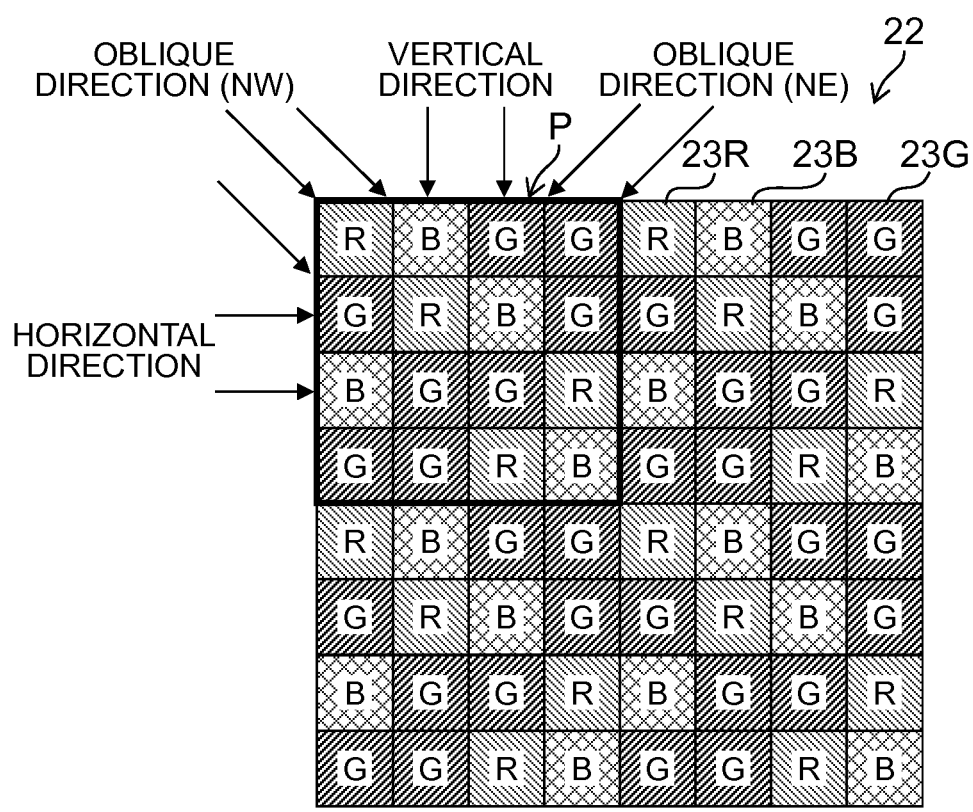
FIG. 3 is a diagram illustrating a color filter array of the first embodiment.

FIG. 3 is a diagram illustrating a color filter array of the first embodiment of a color filter disposed in the color imaging element 12.

As illustrated in FIG. 3, a color filter array 22 formed with the color filter arranged on each pixel 21 is provided on the imaging surface of the color imaging element 12. The color filter array 22 is formed with color filters (hereinafter referred to as "R filter", "G filter" and "B filter") 23R, 23G and 23B of three primary colors of red (R), green (G) and blue (B). Further, any of RGB filters 23R, 23G and 23B is disposed on each pixel 21. In the following, a pixel on which the R filter 23R is disposed is referred to as "R pixel", a pixel on which the G filter 23G is disposed is referred to as "G pixel", and a pixel on which the B filter 23B is disposed is referred to as "B pixel".

Here, the G color corresponds to the first color of the present invention, and the G filter 23G corresponds to the first filter of the present invention. Moreover, the R color and the B color correspond to the second color of the present invention, and RB filters 23R and 23B correspond to the second filter of the present invention.

[First Embodiment of Color Filter Array]

The first embodiment of the color filter array of the color imaging element illustrated in FIG. 3 has following features (1) to (5).

[Feature (1)]

The color filter array illustrated in FIG. 3 includes a basic array pattern P (pattern shown by a bold frame) formed with a square array pattern corresponding to 4×4 pixels, and this basic array pattern P is repeatedly disposed in the horizontal direction and the vertical direction. That is, in this color filter array, filters of respective colors of R, G and B (R filter, G filter and B filter) are periodically arrayed.

Thus, since the R filter, the G filter and the B filter are periodically arrayed, when performing demosaicing processing of R, G and B signals read out from the color imaging element are performed, it is possible to perform the processing according to the repeating pattern.

Moreover, in a case where thinning processing is performed in units of the basic array pattern P to reduce an image, the color filter array of the reduced image subjected to thinning processing can be assumed to be identical to the color filter array before the thinning processing, and it is possible to use a common processing circuit.

[Feature (2)]

In the color filter array illustrated in FIG. 3, the G filter corresponding to the first color (color of G in this embodiment) that contributes to acquire a brightness signal as compared with the second color (colors of R and B in this embodiment) is disposed in each pixel line in the horizontal direction, vertical direction, oblique upper right direction (NE) and oblique lower right direction (NW) of the color filter array. Here, the pixel line denotes a line in which pixels are arrayed in a line in the horizontal, vertical, oblique upper right or oblique upper left direction, which is simply referred to as a "line" hereafter.

Moreover, the oblique upper right direction and the oblique upper left direction are directions inclined by 45° to the horizontal direction and the vertical direction respectively. This is because multiple pixels and color filters are arrayed in a square lattice shape in the horizontal direction and the vertical direction. Therefore, in a case where multiple pixels and color filters are arrayed in the rectangular lattice shape, the directions of diagonal lines of the rectangular lattice correspond to the oblique upper right direction and the oblique lower right direction.

Here, the oblique upper right direction corresponds to one direction of the third direction and fourth direction of the present invention, and the oblique lower right direction corresponds to another direction of the third direction and fourth direction of the present invention.

Since the G filter corresponding to a brightness pixel is disposed in each line in the horizontal direction, vertical direction, oblique upper right direction and oblique lower right direction of the color filter array, it is possible to improve the reproduction precision of demosaicing processing in a high-frequency area without depending on a direction with high frequency of an input image. Here, the demosaicing processing denotes processing that calculates color information on all of RGB every pixel from the mosaic images of RGB accompanied by the color filter array of the single-plate color imaging element (conversion into a simultaneous type), and is also referred to as demosaic processing or demosaicing processing.

[Feature (3)]

In the basic array pattern of the color filter array illustrated in FIG. 3, the pixel numbers of R pixel, G pixel and B pixel corresponding to the R, G and B filters in the basic array pattern are 4 pixels, 8 pixels and 4 pixels respectively. That is, the ratio of respective pixel numbers of R, G and B pixels is 1:2:1, and the pixel number of the G pixel that contributes to acquire a brightness signal is twice each pixel number of the R pixel and the B pixel.

As mentioned above, since the pixel number of the brightness pixel (G pixel) is twice each pixel number of the R and the B pixel, it is possible to suppress the aliasing at the time of demosaicing processing and improve high frequency reproducibility.

[Feature (4)]

In the color filter array illustrated in FIG. 3, one or more R filters and B filters corresponding to second colors of two or more colors (in this embodiment, colors of R and B) other than the first color (color of G) which is a brightness pixel are disposed in each line in the horizontal direction and vertical direction of the color filter array in the basic array pattern P, respectively.

Since the R filter and the B filter are disposed in each line in the horizontal direction and vertical direction of the color filter array, it is possible to suppress the occurrence of color moire (false color). By this means, it is possible not to dispose an optical low-pass filter to suppress the occurrence of the false color in an optical path from the incident surface of the optical system to the imaging surface, or, even in a case where the optical low-pass filter is applied, it is possible to apply the one whose function to cut the high-frequency component to prevent the occurrence of the false color is weak, and it is possible to prevent resolution from deteriorating.

[Feature (5)]

Figure 4:
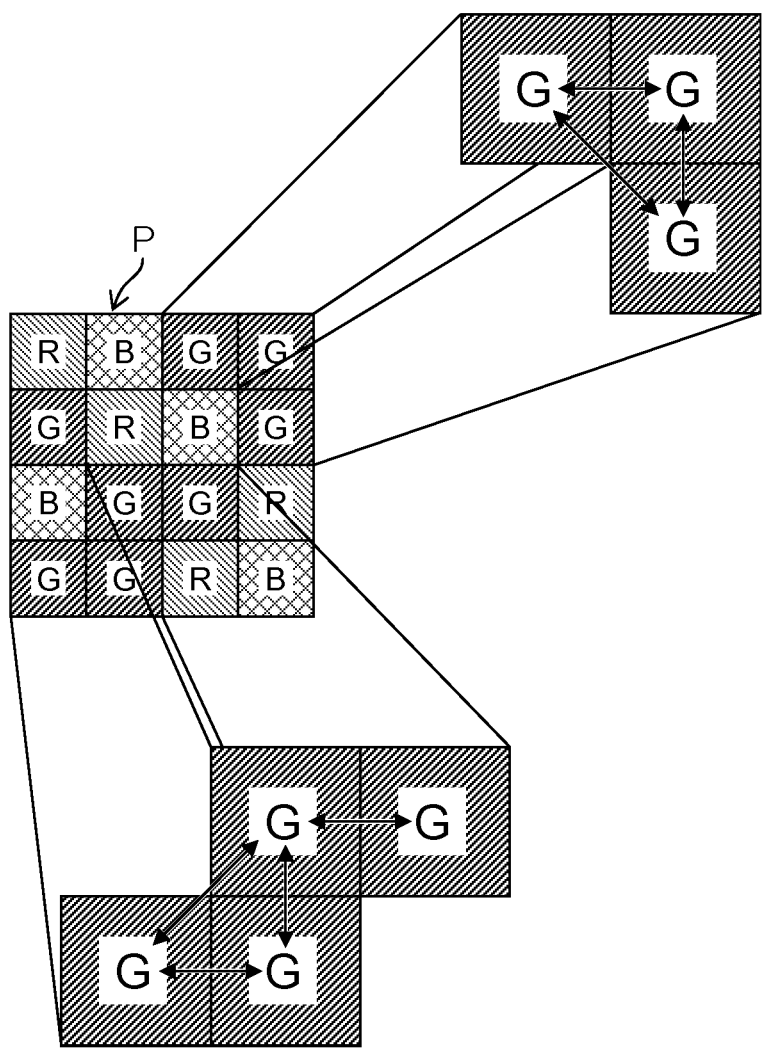
FIG. 4 is a diagram used to describe a method of determining a correlation direction from a pixel value of a G pixel included in the color filter array in FIG. 3.

As illustrated in FIG. 4, in the color filter array, a "lump" of G filters (part in which multiple G filters are adjacent) is present in a period corresponding to the size of the basic array pattern. It is possible to determine a direction with high brightness correlation at minimum pixel intervals by the use of the pixel values of G pixels corresponding to the G filters adjacent in the horizontal direction, vertical direction, oblique upper right direction or oblique lower right direction.

For example, three G pixels corresponding to the G filters in the upper right direction of the basic array pattern P illustrated in FIG. 4 are extracted, and it is possible to calculate the difference absolute value of the pixel values of G pixels adjacent in the horizontal direction, the difference absolute value of the pixel values of G pixels adjacent in the vertical direction, and the difference absolute value of the pixel values of G pixels adjacent in the oblique lower right direction.

Similarly, four G pixels corresponding to the G filters in the lower left direction of the basic array pattern P illustrated in FIG. 4 are extracted, and it is possible to calculate the difference absolute value of the pixel values of G pixels adjacent in the horizontal direction, the difference absolute value of the pixel values of G pixels adjacent in the vertical direction, and the difference absolute value of the pixel values of G pixels adjacent in the oblique upper right direction.

It is possible to determine that there is correlation in a direction with a smaller difference absolute value among the difference absolute values of the pixel values of G pixels in the horizontal direction, vertical direction, oblique upper right direction and oblique lower right direction calculated as above.

That is, according to this color filter array, it is possible to determine a direction with high correlation among the horizontal direction, the vertical direction and the oblique direction by the use of information on G pixels of two consecutive pixels at a minimum pixel interval. Here, the pixel interval denotes the pixel interval (pitch) from the central point of a reference pixel to the central point of an adjacent pixel. This direction determination result can be used for processing that performs interpolation from surrounding pixels (demosaicing processing). Here, in this case, for example, a direction determination processing unit may be installed in the above-mentioned demosaicing processing circuit and the direction determination may be performed in the direction determination processing unit.

Figure 5:
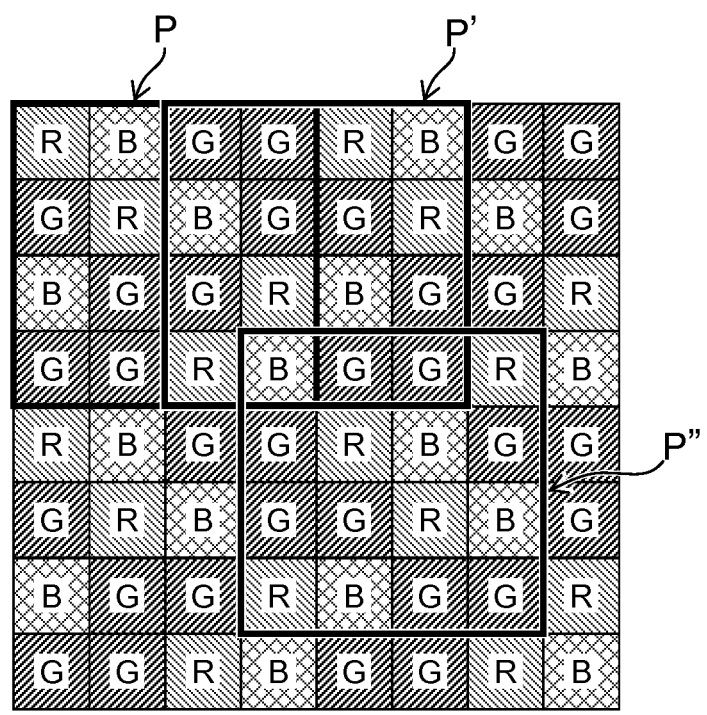
FIG. 5 is a diagram used to describe concept of a basic array pattern included in a color filter array of a color imaging element according to the present invention.

FIG. 5 is a diagram used to describe the concept of the basic array pattern included in the color filter array of a color imaging element according to the present invention.

As illustrated in FIG. 5, when a basic array pattern formed by shifting the basic array pattern P illustrated in FIG. 3 or the like by two pixels in the horizontal direction (right direction on FIG. 5) is assumed to be P' and a basic array pattern formed by shifting it by three pixels in the horizontal direction (right direction on FIG. 5) and the vertical direction (lower direction on FIG. 5) is assumed to be P", the same color filter array is formed even if these basic array patterns P' and P" are repeatedly disposed in the horizontal direction and the vertical direction.

That is, there are multiple basic array patterns that can form the color filter array illustrated in FIG. 5 by repeatedly disposing the basic array pattern in the horizontal direction and the vertical direction. Here, the basic array pattern P' is same as the one rotating the basic array pattern P by 90 degrees in the clockwise direction.

Any basic array pattern (array pattern cut out by 4×4 pixels from the color filter array illustrated in FIG. 5) including the above-mentioned basic array patterns P' and P" has the same features as features (1) to (5) described on the basis of the basic array pattern P.

Moreover, there are multiple variations of the basic array pattern depending on the cutout position of 4×4 pixels as mentioned above, but they further include the one rotating the basic array pattern (color filter array) by 90 degrees, 180 degrees or 270 degrees or the one subjected to mirror symmetry, and color filter arrays formed with these basic array patterns have the same features as features (1) to (5) described on the basis of the basic array pattern P, which are color filter arrays of substantially the same kind.

Here, among color filter arrays having all features (1) to (5) described on the basis of the basic array pattern P, the color filter array according to the present invention is the one in which the basic array pattern size is minimum, and there is substantially one kind thereof.

<Color Filter Array Understood in Another Viewpoint>

The color filter array of the first embodiment illustrated in FIG. 3 can be understood as follows.

Figure 6A:
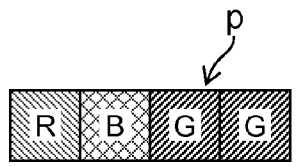
FIG. 6A is a diagram used to describe a color filter array of a color imaging element according to the present invention from another point of view.

As illustrated in FIG. 6A, an array pattern p of 1×4 pixels of RBGG is assumed to be one unit, and, by repeatedly disposing this array pattern p in the horizontal direction, a filter array of one line in the horizontal direction in the color filter array of the first embodiment is formed.

Figure 6B:
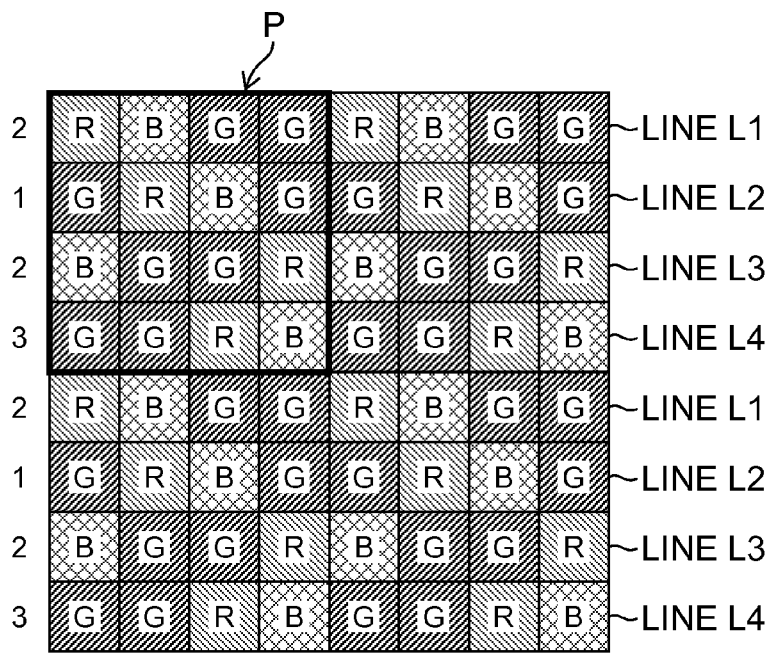
FIG. 6B is another diagram used to describe a color filter array of a color imaging element according to the present invention from another point of view.

Moreover, as illustrated in FIG. 6B, four lines (lines L1 to L4) in the vertical direction corresponding to a basic array pattern of 4×4 pixels are each shifted and disposed in the horizontal direction.

Here, how each line of lines L1 to L4 is shifted is discussed.

On FIG. 6B, the shift amount of a lower side line with respect to an upper side line in vertically adjacent lines is as follows.

Line L1 shifts by two pixels in the right direction with respect to line L4 thereabove, line L2 shifts by one pixel in the right direction with respect to line L1 thereabove, line L3 shifts by two pixels in the right direction with respect to line L2 thereabove, and line L4 shifts by three pixels in the right direction with respect to L3 thereabove, and these are repeated.

That is, lines L1 to L4 are sequentially shifted by two pixels, one pixel, two pixels and three pixels, and so on, in the right direction with respect to respective upper lines and disposed. As shift features of respective lines L1 to L4, the increase and decrease of the shift amount are sequentially repeated within a shift amount range of one pixel to three pixels.

By using an array pattern of two consecutive G's as the array pattern p of 1×4 pixels as mentioned above and shifting lines L1 to L4 as mentioned above, a color filter array having above-mentioned features (1) to (5) is formed.

[Second Embodiment of Color Imaging Element]

Figure 7:
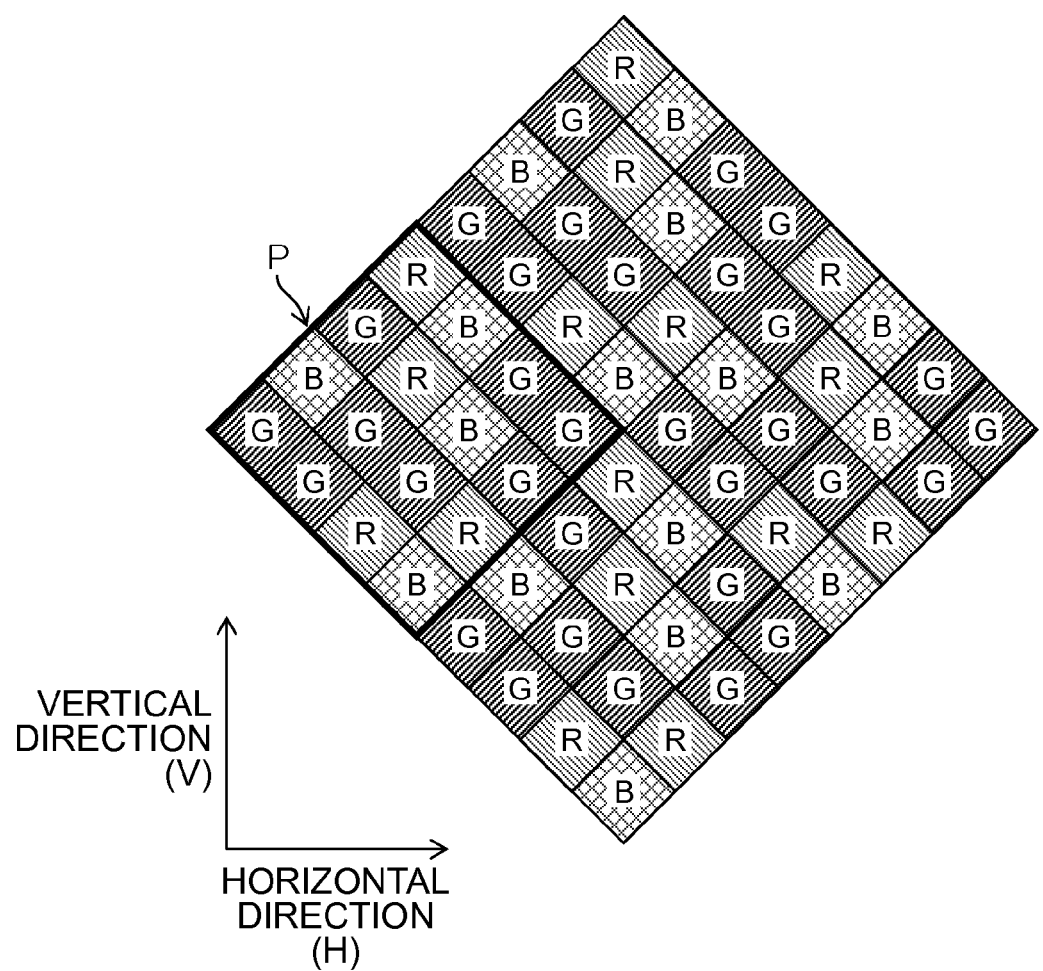
FIG. 7 is a diagram illustrating a color filter array of a second embodiment.

FIG. 7 is a diagram illustrating a color filter array of the second embodiment.

The color filter array of the color imaging element of the second embodiment is different from the first embodiment in that it is applied to a color imaging element in which multiple pixels are arrayed in an oblique lattice shape.

That is, multiple two-dimensionally arrayed pixels of the color imaging element illustrated in FIG. 7 are arrayed in an oblique lattice shape. By this means, pixels on a line in the horizontal direction which are mutually adjacent are shifted by ½ pixels every line and disposed.

Further, the color filter array of the color imaging element illustrated in FIG. 7 includes a basic array pattern P formed with an oblique lattice array pattern corresponding to 4×4 pixels, and this basic array pattern P is repeatedly disposed in an oblique lattice shape.

The color filter array of the second embodiment corresponds to the one rotating the color filter array of the first embodiment illustrated in FIG. 3 by 45°.

Therefore, the color filter array of the second embodiment has features similar to features (1) to (5) of the color filter array of the first embodiment.

Moreover, in the case of a color imaging element in which multiple pixels are arrayed in an oblique lattice shape, a band that can be reproduced in the horizontal and vertical directions becomes √2 times as compared with a color imaging element in which they are arrayed in a square lattice shape, it agrees with a characteristic that the frequency characteristic of man's sight is higher in the horizontal and vertical directions as compared with the oblique direction, and it can be said that it has a visually advantageous structure.

Here, in the case of the color imaging element in which multiple pixels are arrayed in an oblique lattice shape like the second embodiment, the oblique upper right direction corresponds to one direction of the first direction and second direction of the present invention, and the oblique lower right direction corresponds to another direction of the third direction and fourth direction of the present invention.

[Third Embodiment of Color Imaging Element]

Figure 8:
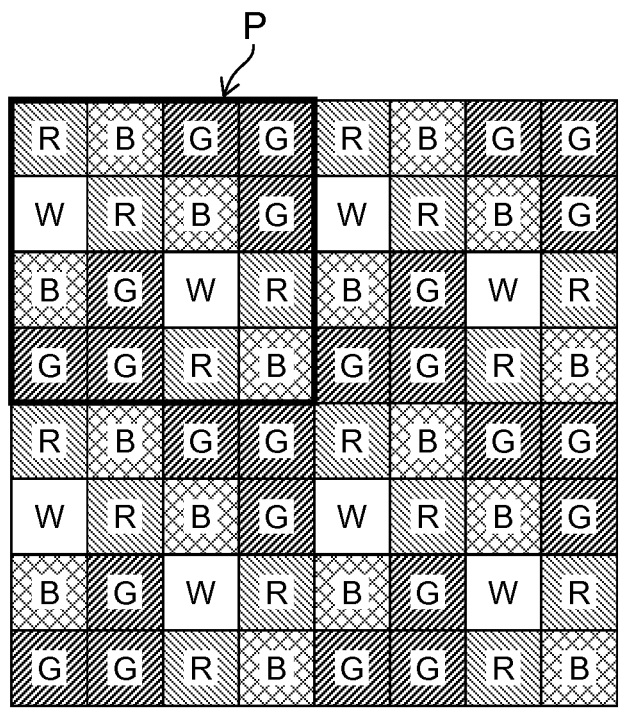
FIG. 8 is a diagram illustrating a color filter array of a third embodiment.

FIG. 8 is a diagram illustrating the color filter array of the third embodiment.

As compared with the first embodiment illustrated in FIG. 3, the color filter array of the color imaging element of the third embodiment is different in that part of G filters in the basic array pattern is replaced with a transparent filter (hereafter referred to as "W filter").

In the color filter array of the third embodiment, at least one of the G filter and W filter corresponding to a brightness pixel is disposed in each line in the horizontal direction, vertical direction, oblique upper right direction and oblique lower right direction of the color filter array, and one R filter and one B filter are disposed in each line in the horizontal direction and vertical direction of the color filter array in the basic array pattern.

Moreover, in the color filter array of the third embodiment, the pixel numbers of the R pixel, G pixel, B pixel and W pixel corresponding to R, G, B and W filters in the basic array pattern are four pixels, six pixels, four pixels and two pixels respectively. That is, the ratio of respective pixel numbers of R, G+W and B pixels is 1:2:1, and the ratio of the total pixel number of brightness pixels (G pixel and W pixel) is twice the ratio of each pixel number of the R pixel and the B pixel.

As mentioned above, the color filter array of the color imaging element of the third embodiment has the same features as features (1) to (5) of the color filter array of the color imaging element of the first embodiment.

Here, as a modification example of the color filter array of the third embodiment, the positions of the G filter and the W filter may be switched. In this case, the determination of the brightness direction can be performed on the basis of the pixel value of an adjacent W pixel.

<Spectral Sensitivity Characteristic of R, G, B and W Pixels>

Figure 9:
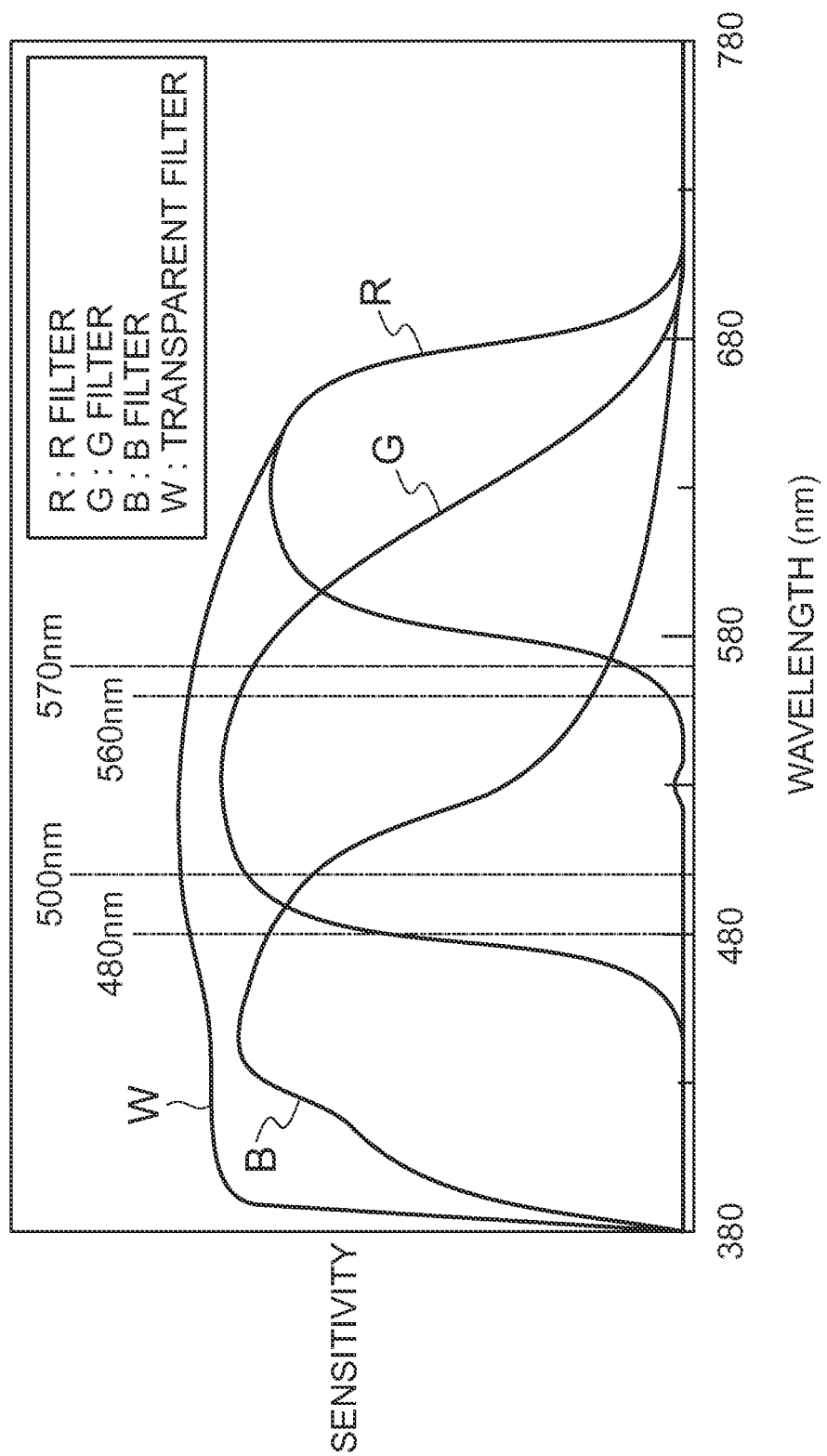
FIG. 9 is a graph illustrating spectral sensitivity characteristic of each photodiode in which an R filter, a G filter, a B filter and a W filter are disposed.

FIG. 9 is a graph illustrating one example of the spectral sensitivity characteristics of respective photodiodes (R, G, B and W pixels) having an R filter, G filter, B filter and W filter.

As illustrated in FIG. 9, the spectral sensitivity characteristic of the W pixel having the W filter is a spectral sensitivity characteristic adding the spectral sensitivity characteristics of the R, G and B pixels, and the wavelength area of the sensitivity includes the wavelength areas of the sensitivities of the R, G and B pixels.

Moreover, the peak of the transmittance of the W filter (peak of the sensitivity of the W pixel) is within a wavelength range from equal to or greater than 480 nm to equal to or less than 570 nm (from 480 nm or more to 570 nm or less), and the transmittance of the W filter is higher than the transmittances of the RB filters in a wavelength range from equal to or greater than 500 nm to equal to or less than 560 nm (from 500 nm or more to 560 nm or less).

By the way, an image signal of the G pixel has a higher contribution ratio at the time of the generation of a brightness signal than image signals of the R pixel and the B pixel. When it is specifically described, the above-mentioned image processing unit 16 generates a Y signal from RGB pixel signals having color information on all of RGB every pixel according to the following expression of [Equation 1].

$$Y=0.3R+0.59G+0.11B \quad \text{[Equation 1]}$$

Since the contribution ratio of the G color becomes 59% in this [Equation 1], the G color has a higher contribution ratio than the R color (contribution ratio of 30%) and the B color (contribution ratio of 11%). Therefore, the G color becomes a color that most contributes to a brightness signal among three primary colors.

Moreover, an image signal of the W pixel may become a brightness signal as it is, but, in the case of the color imaging element of the above-mentioned embodiment in which the G pixel and the W pixel coexist, a brightness signal is generated by mixing the brightness signal calculated in above-mentioned expression of [Equation 1] and the image signal (brightness signal) of the W pixel at a constant rate. The image signal of the W pixel is closer to the brightness signal than the image signal of the G pixel and naturally closer to the brightness signal than the image signals of the R pixel and B pixel, and is calculated like the following expression, for example.

$$Y=0.5W+0.5(0.3R+0.59G+0.11B) \quad \text{[Equation 2]}$$

That is, the contribution ratio to acquire the brightness signal is at least 50% or more in brightness pixels (G pixel and W pixel) corresponding to the first color of one or more colors of the present invention, and the contribution ratio to acquire the brightness signal is less than 50% in each pixel (R pixel and B pixel) corresponding to the second colors of two or more colors other than the first color. Here, 50% is a value defined to distinguish the first color and the second colors by the contribution ratio to acquire the brightness signal, and is a value defined such that the "first color" includes a color whose contribution ratio to acquire the brightness signal is relatively higher than the R color and the B color, and so on.

An explanation is given where the G filter of the G color and the W filter of the transparency are used as an example of the first filter having the first color of the present invention, but a filter that satisfies any of following conditions (1) to (4) may be used instead of the G filter or instead of part of the G filter.

<Condition of First Filter (First Color)>
[Condition (1)]

Condition (1) is that the contribution ratio to acquire a brightness signal is 50% or more as mentioned above.

The contribution ratios of other colors than the G color can also be acquired by experiment or simulation. Therefore, a filter having a color whose contribution ratio is 50% or more excluding the G color can be used as the first filter of the present invention. Here, a color whose contribution ratio is less than 50% becomes the second color (such as the R color and the B color) of the present invention, and a filter having this color becomes the second filter of the present invention.

[Condition (2)]

Condition (2) is that the peak of the transmittance of a filter is within a wavelength range from equal to or greater than 480 nm to equal to or less than 570 nm. As for the transmittance of the filter, for example, a value measured by a spectrophotometer is used. This wavelength range is a range defined to distinguish the first color (such as the G color) and the second color (such as the R and B colors) of the present invention, which is a range defined such that the peak of the R color or B color whose contribution ratio mentioned above is relatively low is not included and the peak of the G color whose contribution ratio is relatively high is included. Therefore, a filter in which the peak of transmittance is within a wavelength range from equal to or greater than 480 nm to equal to or less than 570 nm can be used as the first filter. Here, a filter in which the peak of transmittance is outside the wavelength range from equal to or greater than 480 nm to equal to or less than 570 nm becomes the second filter (R filter and B filter) of the present invention.

[Condition (3)]

Condition (3) is that the transmittance within a wavelength range from equal to or greater than 500 nm to equal to or less than 560 nm is higher than the transmittance of the second filter (R filter and B filter). Even in this condition (3), as for the filter transmittance, for example, a value measured by a spectrophotometer is used. The wavelength range of this condition (3) is a range defined to distinguish the first color (such as the G color) and the second color (such as the R and B colors) of the present invention, and denotes a range in which the transmittance of a filter having a color whose contribution ratio mentioned above is relatively higher than the R color and the B color is higher than the transmittance of the RB filters. Therefore, a filter in which the transmittance is relatively high within a wavelength range from equal to or greater than 500 nm to equal to or less than 560 nm can be used as the first filter, and a filter in which the transmittance is relatively low can be used as the second filter.

[Condition (4)]

Condition (4) is that filters of two or more colors including a color that most contributes to a brightness signal among three primary colors (for example, the G color of RGB) and a color different from these three primary colors (fourth color) can be used as the first filter. In this case, a filter corresponding to a color different from each color of the first filter becomes the second filter.

<Transparent Filter (W Filter)>

In the third embodiment, a color filter formed with RGBW filters corresponding to RGB colors and transparent color is shown.

The W filter is a filter of a transparent color (first color). The W filter can transmit light corresponding to the wavelength region of visible light, and, for example, denotes a filter in which the light transmittance of each color of RGB is 50% or more. Since the transmittance of the W filter is higher than that of the G filter, the contribution ratio to acquire a brightness signal is also higher than the G color (59%), and above-mentioned condition (1) is satisfied.

FIG. 9 is a graph illustrating one example of the spectral sensitivity characteristic of respective photodiodes having the R filter, the G filter, the B filter and the W filter.

In FIG. 9 that illustrates the spectral sensitivity characteristic of the color filter array (light receiving element), the transmittance peak of the W filter (sensibility peak of the white pixel) is within a wavelength range from equal to or greater than 480 nm to equal to or less than 570 nm. Moreover, the transmittance of the W filter is higher than the transmittances of the RB filters within a wavelength range from equal to or greater than 500 nm to equal to or less than 560 nm. Therefore, the W filter satisfies above-mentioned conditions (2) and (3). Here, similarly to the W filter, even the G filter satisfies above-mentioned conditions (1) to (3).

Thus, since the W filter satisfies above-mentioned conditions (1) to (3), it is possible to use it as the first filter of the present invention. Here, in the color filter array, since part of the G filter corresponding to the G color that most contributes to a brightness signal among three primary colors of RGB is replaced with the W filter, above-mentioned condition (4) is satisfied.

<Multiple Kinds of First Filters (G Filters)>

A G filter of the G color as the first filter is not limited to one kind, and, for example, multiple kinds of G filters can be used as the first filter. That is, the G filter of the color filter (basic array pattern) according to the above-mentioned embodiment may be arbitrarily replaced with the G1 filter and the G2 filter.

Figure 10:
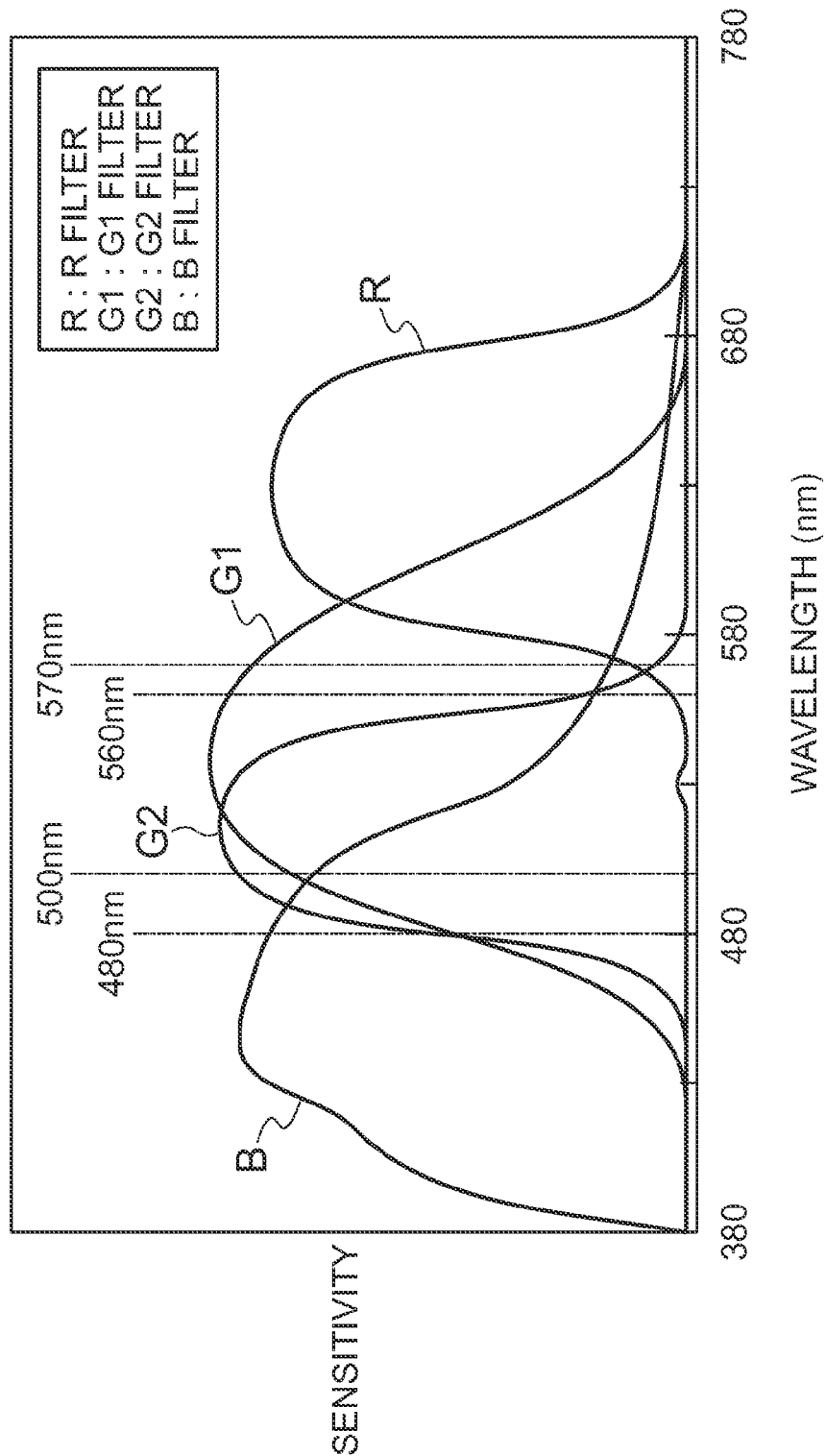
FIG. 10 is a graph illustrating spectral sensitivity characteristic of each photodiode in which an R filter, a G1 filter, a G2 filter and a B filter are disposed.

FIG. 10 is a graph illustrating one example of the spectral sensitivity characteristics of respective photodiodes having the R filter, the G1 filter, the G2 filter and the B filter. The G1 filter transmits the G light of the first wavelength band, and the G2 filter transmits the G light of the second wavelength band having high correlation with the G1 filter.

It is possible to use an existing G filter (for example, the G filter of the first embodiment) as the G1 filter. Moreover, it is possible to use a filter having high correlation with the G1 filter, as the G2 filter. In this case, it is desirable that the peak value of the spectral sensitivity curve of a light receiving element in which the G2 filter is disposed is within a wavelength range from equal to or greater than 500 nm to equal to or less than 535 nm (near the peak value of the spectral sensitivity curve of a light receiving element in which the existing G filter is disposed), for example. Here, for example, the method described in Japanese Patent Application Laid-Open No. 2003-284084 is used as a method of deciding color filters of four colors (R, G1, G2, B).

Thus, by assuming image colors acquired by the color imaging element to be four kinds and adding acquired color information, it is possible to express colors more accurately as compared with a case where only three kinds of colors (RGB) are acquired. That is, a color seen as the different one by the eyes can be reproduced as the different color, and a color seen as the same one by the eyes can be reproduced as the same color (improve "discrimination of colors").

Here, since the transmittances of the G1 and G2 filters are basically the same as the transmittance of the G filter of the first embodiment, the contribution ratio to acquire a brightness signal becomes higher than 50%. Therefore, the G1 and G2 filters satisfy above-mentioned condition (1).

Moreover, in FIG. 10 illustrating the spectral sensitivity characteristics of the color filter array (light receiving element), the peaks of the transmittances of the G1 and G2 filters (peak of the sensitivity of each G pixel) are within a wavelength range from equal to or greater than 480 nm to equal to or less than 570 nm. The transmittances of the G1 and G2 filters are higher than the transmittances of the RB filters in a wavelength range from equal to or greater than 500 nm to equal to or less than 560 nm. Therefore, the G1 and G2 filters satisfy above-mentioned conditions (2) and (3).

Here, the disposition and number of the G1 and G2 filters may be arbitrarily changed. Moreover, the kinds of G filters may be increased to three kinds or more.

<Emerald Filter (E Filter)>

Part of the G filter in the color filter array of the first embodiment may be replaced with an E filter that transmits the emerald (E) color. By this means, it is possible to improve the reproduction of the higher frequency component of brightness, reduce the jagginess and improve the resolution feeling.

Figure 11:
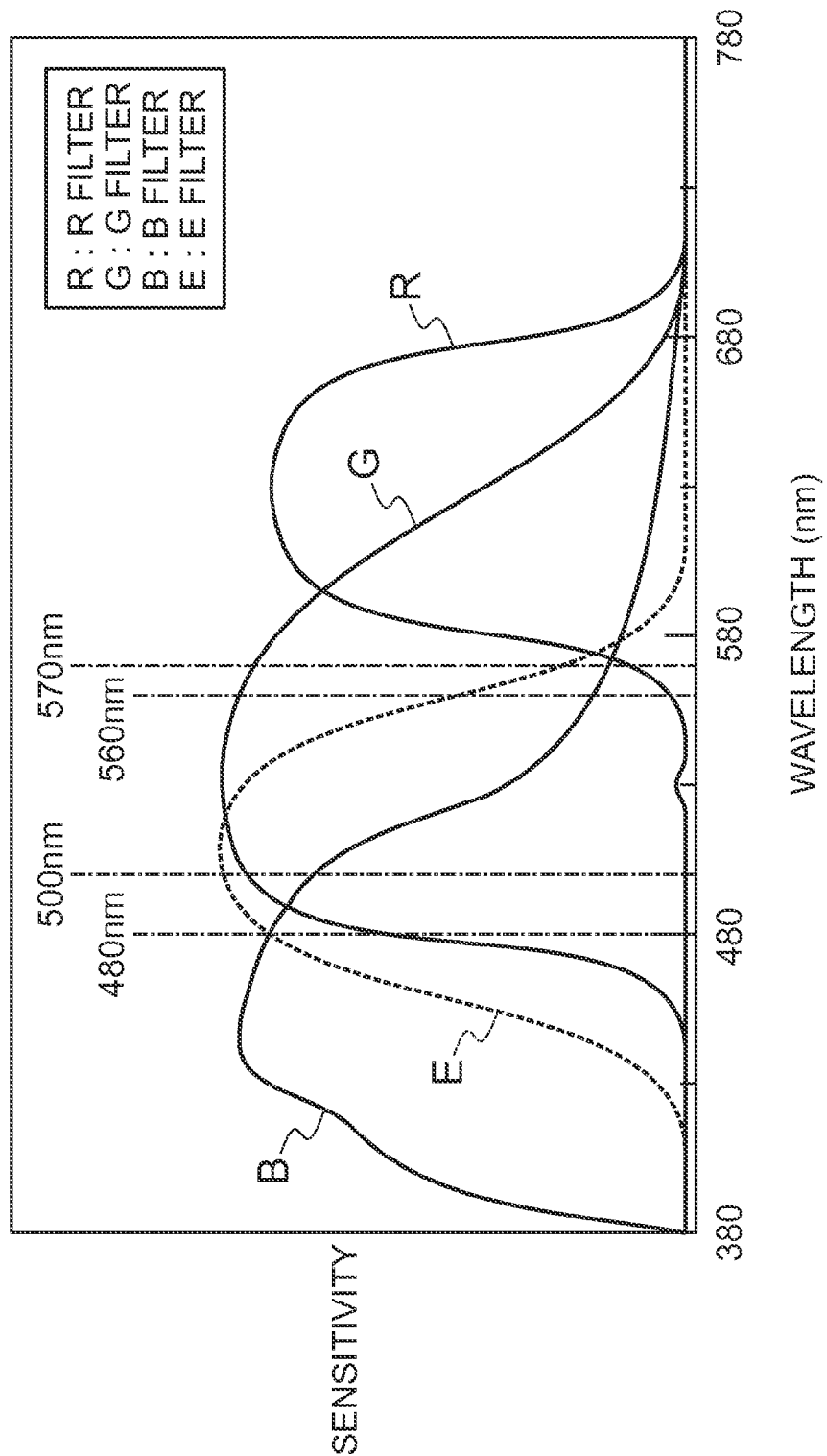
FIG. 11 is a graph illustrating spectral sensitivity characteristic of each photodiode in which an R filter, a G filter, a B filter and an E filter are disposed.
Figure 12:
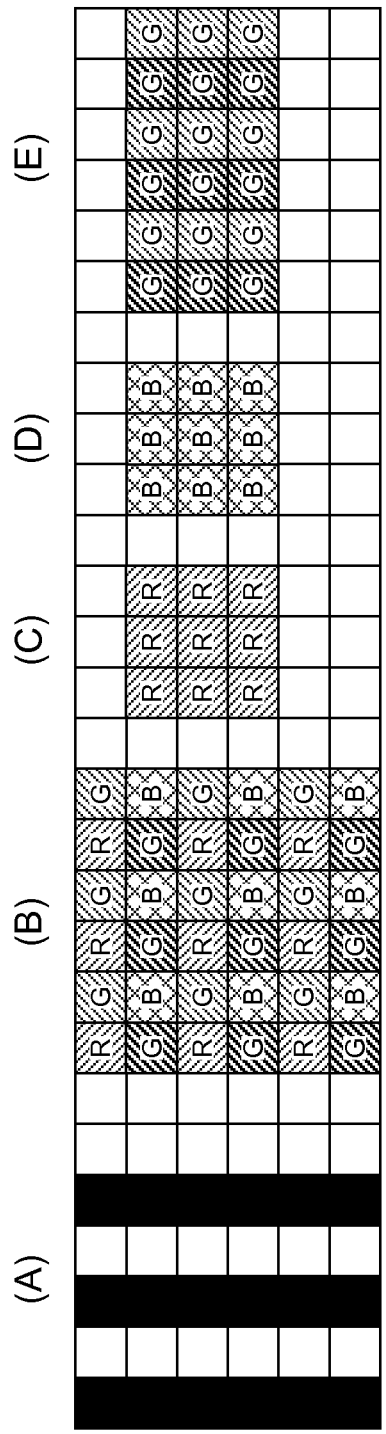
FIG. 12 is a diagram used to describe a problem of a color imaging element having a color filter of a Bayer array in the related art.
Figure 13:
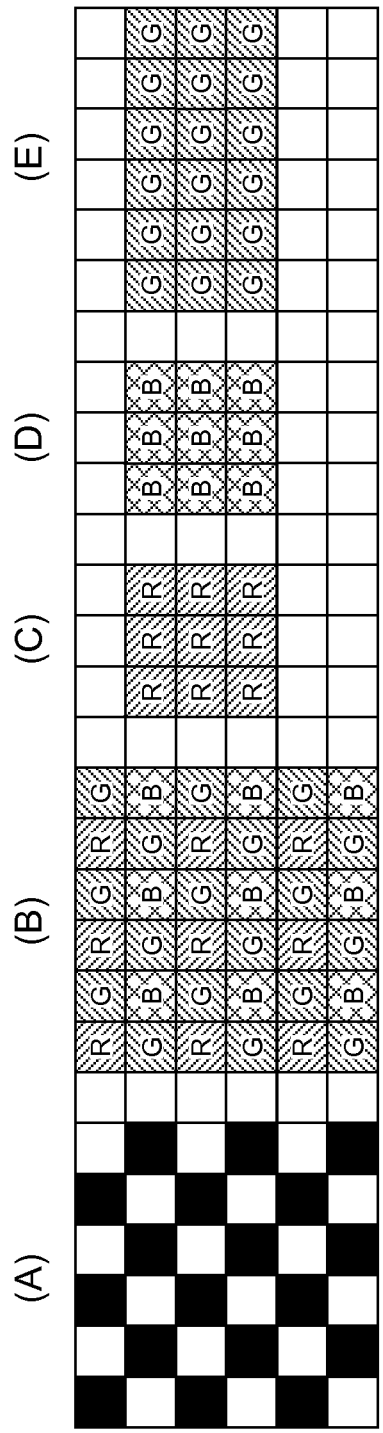
FIG. 13 is another diagram used to describe a problem of a color imaging element having a color filter of a Bayer array in the related art.

FIG. 11 is a graph illustrating one example of the spectral sensitivity characteristics of respective photodiodes having the R filter, the G filter, the B filter and the E filter.

In FIG. 11 that illustrates the spectral sensitivity characteristic of the color filter array (light receiving element), the transmittance peak of the E filter (sensibility peak of the E pixel) is within a wavelength range from equal to or greater than 480 nm to equal to or less than 570 nm. Moreover, the transmittance of the E filter becomes higher than the transmittances of the RB filters within a wavelength range from equal to or greater than 500 nm to equal to or less than 560 nm. Therefore, the E filter satisfies above-mentioned conditions (2), (3) and (4).

Here, in the spectral characteristic illustrated in FIG. 11, the E filter has a peak on the shorter wavelength side than the G filter, but there may be a case where it has the peak on the longer wavelength side than the G filter (it is seen as a color slightly close to yellow). Thus, as the E filter, it is possible to arbitrarily select the one that satisfies each condition of the present invention, and, for example, it is also possible to select the emerald filter E that satisfies condition (1).

[Other Types of Colors]

A color filter array formed with color filters of primary colors RGB has been described in the above-mentioned respective embodiments, but, for example, the present invention is applicable even to a color filter array of complementary color filters of four colors adding G to C (cyan), M (magenta), and Y (yellow) which are complementary colors of primary colors RGB. Even in this case, a color filter that satisfies any of above-mentioned conditions (1) to (4) is assumed to be the first filter of the present invention and the other color filters are assumed to be the second filter.

[Others]

As an embodiment in which color filters of other colors are added to color filters of three primary colors of RGB, for example, an example has been described where color filters of respective colors of transparency (W), green (G2) and emerald (E) which are one example of the fourth color other than three primary colors are added, but the kinds of color filters are not limited to the above-mentioned embodiment. For example, a filter that transmits an infrared region (an infrared ray cut filter is not provided) and cuts the wavelength region of visible light may be used as filters of other colors.

Moreover, the present invention is also applicable to a color filter array of complementary color filters of four colors adding G to C (cyan), M (magenta) and Y (yellow) which are complementary colors of primary colors RGB.

A color imaging element mounted to a digital camera has been described in the above-mentioned embodiments, but the present invention is applicable to a color imaging element mounted to various kinds of electronic equipment (imaging devices) having a photograph function such as a smart phone, a mobile telephone and a PDA.

In addition, it is needless to say that the present invention is not limited to the above-mentioned embodiments and various changes are possible without departing from the spirit of the present invention.

What is claimed is:

1. A single-plate color imaging element including:
multiple pixels, each of which includes a photoelectric conversion element arrayed in a first direction and a second direction which is perpendicular to the first direction; and
color filters which are respectively arrayed on the multiple pixels,
wherein: an array of the color filters includes a basic array pattern formed by arraying the color filters in an array pattern corresponding to 4×4 pixels in the first direction and the second direction, and the basic array pattern is repeatedly disposed in the first direction and the second direction;
the array of the color filters includes a first filter corresponding to a first color of one or more colors and second filters corresponding to second colors of two or more colors whose contribution ratio to acquire a brightness signal is lower than that of the first color;

one or more first filters are disposed in a pixel line in each direction including the first direction, the second direction, and a third direction and a fourth direction that incline to the first direction and the second direction in the array of the color filters, and two first filters are disposed in each pixel line in the first direction and the second direction in the basic array pattern;

one second filter corresponding to each color of the second colors is disposed in each pixel line in the first direction and the second direction in the basic array pattern, respectively; and the array of the color filters includes consecutive first filters of two or more pixels in the first direction, the second direction, the third direction and the fourth direction, respectively.

2. The color imaging element according to claim 1, wherein the first color includes a color of one or more colors among first green (G), second green (G) whose wavelength region is different from the first green (G), and white (W), and the second colors include colors of red (R) and blue (B).

3. An imaging device comprising:
an imaging optical system;
a color imaging element in which an object image is formed through the imaging optical system; and
an image data generation unit configured to generate image data of the formed object image,
wherein the color imaging element is a color imaging element according to claim 1.

4. A single-plate color imaging element including:
multiple pixels, each of which includes a photoelectric conversion element arrayed in a first direction and a second direction which is perpendicular to the first direction; and
color filters which are respectively arrayed on the multiple pixels,
wherein: an array of the color filters includes a basic array pattern formed by arraying the color filters in an array pattern corresponding to 4×4 pixels in the first direction and the second direction, and the basic array pattern is repeatedly disposed in the first direction and the second direction;
the array of the color filters includes a first filter corresponding to a first color of one or more colors whose transmittance peak is within a wavelength range from 480 nm or more to 570 nm or less, and second filters corresponding to second colors of two or more colors whose transmittance peak is outside the range;
one or more first filters are disposed in a pixel line in each direction including the first direction, the second direction, and a third direction and a fourth direction that incline to the first direction and the second direction in the array of the color filters, and two first filters are disposed in each pixel line in the first direction and the second direction in the basic array pattern;
one second filter corresponding to each color of the second colors is disposed in each pixel line in the first direction and the second direction in the basic array pattern; and
the array of the color filters includes consecutive first filters of two or more pixels in the first direction, the second direction, the third direction and the fourth direction.

5. An imaging device comprising:
an imaging optical system;
a color imaging element in which an object image is formed through the imaging optical system; and
an image data generation unit configured to generate image data of the formed object image,
wherein the color imaging element is a color imaging element according to claim 4.

6. A single-plate color imaging element including:
multiple pixels, each of which includes a photoelectric conversion element arrayed in a first direction and a second direction which is perpendicular to the first direction; and
color filters which are respectively arrayed on the multiple pixels,
wherein: an array of the color filters includes a basic array pattern formed by arraying the color filters in an array pattern corresponding to 4×4 pixels in the first direction and the second direction, and the basic array pattern is repeatedly disposed in the first direction and the second direction;
the color filters include a first filter corresponding to a first color of one or more colors and second filters corresponding to second colors of two or more colors whose transmittance is lower than that of the first filter within a wavelength range from 500 nm or more to 560 nm or less;
one or more first filters are disposed in a pixel line in each direction including the first direction, the second direction, and a third direction and a fourth direction that incline to the first direction and the second direction in the array of the color filters, and two first filters are disposed in each pixel line in the first direction and the second direction in the basic array pattern;
one second filter corresponding to each color of the second colors is disposed in each pixel line in the first direction and the second direction in the basic array pattern; and
the array of the color filters includes consecutive first filters of two or more pixels in the first direction, the second direction, the third direction and the fourth direction.

7. An imaging device comprising:
an imaging optical system;
a color imaging element in which an object image is formed through the imaging optical system; and
an image data generation unit configured to generate image data of the formed object image,
wherein the color imaging element is a color imaging element according to claim 6.

8. A single-plate color imaging element including:
multiple pixels, each of which includes a photoelectric conversion element arrayed in a first direction and a second direction which is perpendicular to the first direction; and
color filters which are respectively arrayed on the multiple pixels,
wherein: an array of the color filters includes a basic array pattern formed by arraying the color filters in an array pattern corresponding to 4×4 pixels in the first direction and the second direction, and the basic array pattern is repeatedly disposed in the first direction and the second direction;
the color filter array includes first filters corresponding to first colors of two or more colors including a color that most contributes to a brightness signal among three primary colors and a fourth color that is a different color from three primary colors, and second filters corresponding to second colors of two or more colors other than the first colors;
one or more first filters are disposed in a pixel line in each direction including the first direction, the second direction, and a third direction and a fourth direction that incline to the first direction and the second direction in the array of the color filters, and two first filters are disposed in each pixel line in the first direction and the second direction in the basic array pattern;

one second filter corresponding to each color of the second colors is disposed in each pixel line in the first direction and the second direction in the basic array pattern; and the array of the color filters includes consecutive first filters of two or more pixels in the first direction, the second direction, the third direction and the fourth direction.

9. The color imaging element according to claim 8, wherein a contribution ratio of the first color to acquire a brightness signal is equal to or greater than 50% and a contribution ratio of the second colors to acquire the brightness signal is less than 50%.

10. An imaging device comprising:

an imaging optical system;

a color imaging element in which an object image is formed through the imaging optical system; and an image data generation unit configured to generate image data of the formed object image, wherein the color imaging element is a color imaging element according to claim 8.

* * * * *